United States Patent
Keskin et al.

(10) Patent No.: US 9,591,423 B2
(45) Date of Patent: Mar. 7, 2017

(54) NONLINEAR POWER SUPPLY RAMPING FOR POP-CLICK NOISE REDUCTION

(71) Applicant: QUALCOMM Incorporated, San Diego, CA (US)

(72) Inventors: Mustafa Keskin, San Diego, CA (US); Khalid Junaid Sidiqi, San Diego, CA (US); Derick Hugunin, San Diego, CA (US); James Ian Jaffee, Solana Beach, CA (US); Louis Dominic Oliveira, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 8 days.

(21) Appl. No.: 14/630,994

(22) Filed: Feb. 25, 2015

(65) Prior Publication Data

US 2016/0255451 A1 Sep. 1, 2016

(51) Int. Cl.
| | |
|---|---|
| *H04B 15/00* | (2006.01) |
| *H04S 1/00* | (2006.01) |
| *H04R 3/00* | (2006.01) |
| *H04R 5/04* | (2006.01) |
| *H03F 1/30* | (2006.01) |
| *H03F 3/181* | (2006.01) |

(52) U.S. Cl.
CPC .............. *H04S 1/005* (2013.01); *H03F 1/305* (2013.01); *H03F 3/181* (2013.01); *H04R 3/00* (2013.01); *H04R 5/04* (2013.01)

(58) Field of Classification Search
CPC .. H03G 3/34; H03G 3/348; H03F 1/30; H03F 1/305

USPC ..... 381/94.1, 94.5, 94.8; 330/123, 127, 199, 330/297

See application file for complete search history.

(56) References Cited

U.S. PATENT DOCUMENTS

| | | | | |
|---|---|---|---|---|
| 4,038,496 | A * | 7/1977 | Feezor .................. | A61B 5/121 73/585 |
| 5,742,204 | A * | 4/1998 | Bell ....................... | H03H 11/24 327/308 |
| 6,144,862 | A * | 11/2000 | Oliver .............. | H04L 25/03834 375/285 |
| 6,346,854 | B1 * | 2/2002 | Heithoff .................. | H03F 1/305 330/149 |
| 7,545,217 | B1 | 6/2009 | Reyes | |
| 8,325,940 | B2 | 12/2012 | Larsen et al. | |
| 8,526,636 | B1 | 9/2013 | Pai et al. | |
| 2005/0195991 | A1 * | 9/2005 | Wang ..................... | H03F 1/305 381/94.5 |
| 2007/0223741 | A1 * | 9/2007 | Seaberg .................. | H03F 1/305 381/120 |
| 2008/0054993 | A1 * | 3/2008 | Rashid .................... | H03F 1/305 327/538 |

(Continued)

OTHER PUBLICATIONS

Allen, P.E. "Lecture 060—Push-Pull Output Stages." Jan. 11, 2004. Web.*

(Continued)

*Primary Examiner* — Joseph Saunders, Jr.
*Assistant Examiner* — James Mooney
(74) *Attorney, Agent, or Firm* — Haynes and Boone, LLP

(57) ABSTRACT

A nonlinear power supply generator is provided that nonlinearly changes a power supply voltage for a circuit during power up of the circuit to reduce high-frequency noise in an output signal from the circuit.

20 Claims, 5 Drawing Sheets

(56) References Cited

U.S. PATENT DOCUMENTS

| | | |
|---|---|---|
| 2008/0170720 A1 | 7/2008 | Rashid |
| 2009/0196435 A1 | 8/2009 | Miao |
| 2011/0123048 A1 | 5/2011 | Wang et al. |
| 2012/0163632 A1 | 6/2012 | Lesso et al. |
| 2013/0057342 A1* | 3/2013 | Zhu .......................... H03F 3/21 330/127 |
| 2013/0156230 A1 | 6/2013 | Dhanasekaran |
| 2014/0098974 A1 | 4/2014 | Viegas |

OTHER PUBLICATIONS

International Search Report and Written Opinion—PCT/US2016/014986—ISA/EPO—Apr. 21, 2016.
Co-pending U.S. Appl. No. 14/078,050, filed Nov. 12, 2013.

* cited by examiner

NONLINEAR POWER SUPPLY RAMPING FOR POP-CLICK NOISE REDUCTION

TECHNICAL FIELD

This application relates to glitch reduction, and more particularly to a nonlinear power supply ramping for reducing pop-click noise.

BACKGROUND

The drivers for the stereo channels in an audio system typically comprise CMOS inverters that act in a push and pull fashion to drive the audio signal to speakers such as contained in headphones. Upon powering up such drivers, it is conventional for transients to be produced at the output of the drivers that cause audible "pop and click" noises in the corresponding speakers. This pop and click noise negatively impacts the user's enjoyment of the sound system. To reduce or eliminate this noise requires that the transient signals at the output of the drivers have extremely low levels such as 100 mV or lower.

Accordingly, there is a need in the art for amplifiers with improved noise reduction.

SUMMARY

Systems and methods are disclosed for the nonlinear ramping of at least one power supply voltage for an audio driver to reduce pop and click noise upon power up of the audio driver. This nonlinear ramping occurs over a power-up time period. In a conventional system, the at least one power supply voltage would be changed at a relatively constant rate over the power-up time period. But as disclosed herein, the constant rate of change is instead smoothed to reduce a high frequency content of the resulting output signal from the audio driver. For example, some of the high frequencies was conventionally caused by the sudden transition from the discharged powered-off value for the at least one power supply voltage to its constant rate of change. In general, it is desirable for the power-up time period to be relatively short so as to reduced delay in the transition to the active mode for the audio driver. The constant rate of change is thus relatively fast to accomplish the necessary DC voltage transition for the power supply voltages. To reduce the high-frequency shock of transitioning to this relatively fast rate of change, the nonlinear ramping of the power supply voltage (or voltages) starts from a relatively slow rate and then continues to increase. Since this rate of change starts slower than the conventional linear rate of change over the same power-up time period, the rate of change for the nonlinear ramping must eventually accelerate to faster than what would be accomplished by a linear rate of change in this power-up time period. In this fashion, the nonlinear ramping can accomplish the desired voltage transition over the power-up time period. But such a relatively fast rate of change would then produce additional high-frequency shock in the resulting output signal if it were suddenly terminated upon reaching the desired nominal or default level as is conventional. So the smoothing also occurs at the end of the power-up period as well in that the rate of change for the power supply voltage is decelerated down to zero.

An ideal nonlinear ramping that possesses the desired degree of high-frequency suppression in the output signal is a nonlinear ramping according to a raised cosine function or its approximation such as a piecewise-linear approximation. Other nonlinear functions include a Gaussian shaping of the power supply voltage changes. These advantageous features and additional advantageous features may be better appreciated with regard to the following detailed description of example embodiments.

BRIEF DESCRIPTION OF THE FIGURES

Embodiments of the present disclosure and their advantages are best understood by referring to the detailed description that follows. It should be appreciated that like reference numerals are used to identify like elements illustrated in one or more of the figures.

DETAILED DESCRIPTION

Circuits and methods are provided to eliminate or reduce pop and click noise or related glitches upon power-up of an electronic system. The following discussion will focus on the reduction of pop and click noise in an audio system but it will be appreciated that the principles disclosed herein may be widely applied to the elimination of glitches or noise that may occur upon the power-up of switches, voltage regulators or charge pumps, and other circuits such as line drivers. To produce sound in an audio system, it is conventional for each channel to be driven by a corresponding driver. To reduce or eliminate pop and click noise in the corresponding speaker(s) driven by the driver, a nonlinear ramping of the power supply voltage (or voltages in a dual-supply embodiment) for the driver is introduced. This is quite advantageous as the resulting noise reduction is readily implemented without major modifications to the conventional power supplies for the driver.

Figure 1:
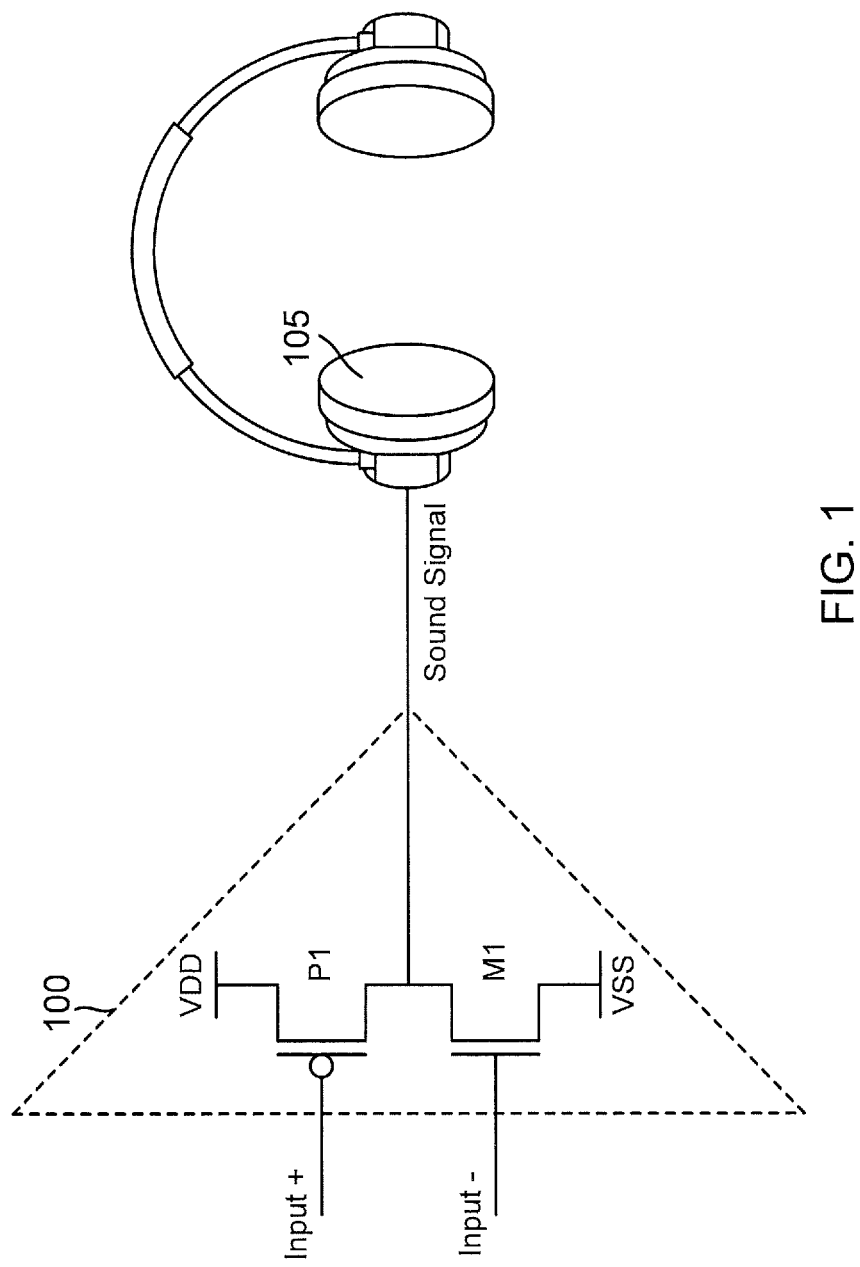
FIG. 1 is a circuit diagram of an example driver in accordance with an embodiment of the disclosure

The power supply voltages VDD and VSS are shown in FIG. 1 for an example driver 100 is shown in FIG. 1. Should driver 100 be a dual-supply driver, both the VDD power supply voltage and the VSS power supply voltage are nonlinearly ramped from ground to their default powered-on values to eliminate pop and click noise in a speaker driven by driver 100 such as contained in a headphone 105. If driver 100 is a single-supply driver, only the VDD power supply voltage would be ramped as the VSS power supply voltage would remain at ground. In general, there would be one driver 100 for each channel of audio signal such that a stereo system would include two drivers 100, one for the right channel and one for the left. A ground signal to the speaker in headphone 105 is not shown for illustration clarity. There would thus be three wires or leads to drive headphone 105: one for the right channel drive, one for the left channel drive, and a ground.

When a user is not listening to audio, driver 100 is powered down to save power. For example, driver 100 may be part of a portable device such as a cellular telephone in which power must be conserved to extend battery life. The VDD and VSS power supply voltages would thus both be discharged during such quiescent periods. Should a user decide to use the mobile device to listen to audio such as music, the mobile device powers on driver 100 by charging the VDD and VSS power supply voltages to their nominal or default values ($VDD_{nominal}$ and $VSS_{nominal}$, respectively). The values for these default values may vary depending upon the desired power supply voltage levels. For example, $VDD_{nominal}$ may equal 1.8V whereas $VSS_{nominal}$ may equal −1.8V in one embodiment. Alternatively, $VDD_{nominal}$ may equal some other voltage value such as 3.3V whereas $VSS_{nominal}$ may equal −3.3V. Driver 100 includes a CMOS stack of a PMOS transistor P1 having its source coupled to a power supply node carrying the VDD power supply voltage and its drain coupled to an output node for carrying the audio-modulated output signal to drive the speaker. Driver 100 also includes an NMOS transistor M1 having its source coupled to a power supply node supplying the VSS power supply voltage and having its drain coupled to the output node. A positive input signal (input+) drives the gate of transistor P1. Similarly, a negative input signal (input−) drives the gate of transistor M1. In the default powered on state, the positive input signal is driven to a default value such as $VDD_{nominal}/2$. Similarly, the negative input signal is driven to a default value such as $VSS_{nominal}/2$. In a conventional system, as the power supply voltages VDD and VSS are driven to their nominal values, the sudden change in the power supply voltages causes abrupt voltage glitches of, for example, 300 mV at the output of driver 100. This voltage glitch causes the speaker to produce the pop and click noise. In contrast, the nonlinear ramping of the power supply voltages as disclosed herein eliminate or reduce this glitch such that the user is not subjected to a pop and click noise.

Figure 2:
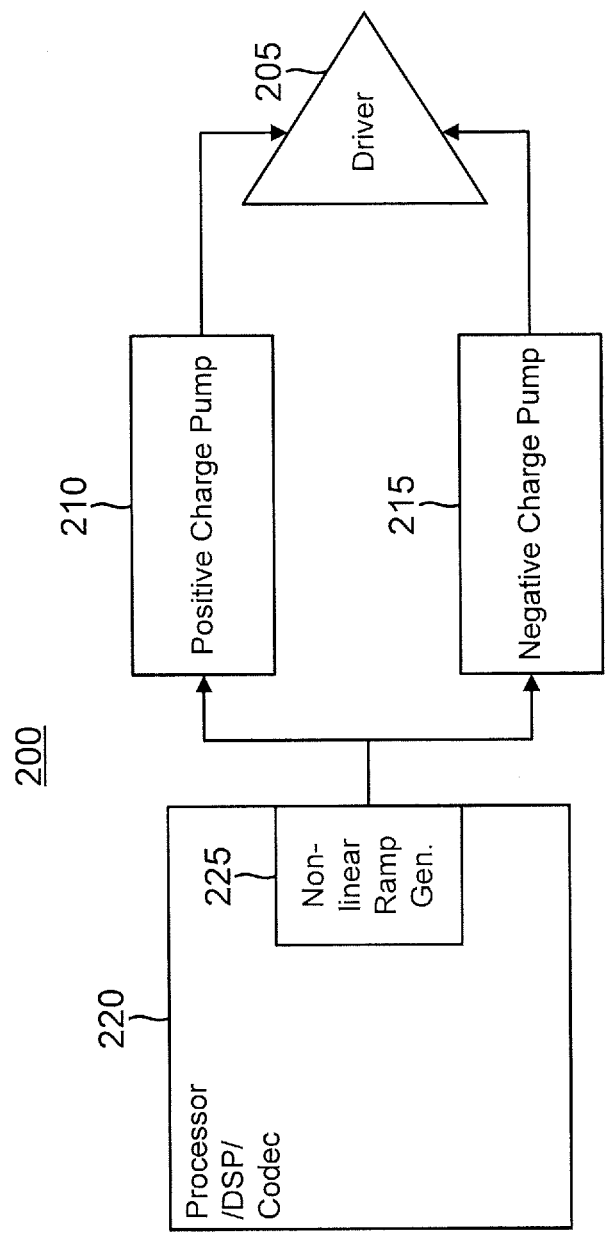
FIG. 2 is a diagram of a system configured to nonlinearly ramp the power supply voltages for the driver of FIG. 1 during power-up in accordance with an embodiment of the disclosure.

An example system 200 configured to nonlinearly change the power supply voltages for a driver 205 is shown in FIG. 2. A processor 220 such as a digital signal processor (DSP) implements the coder-decoder (CODEC) for decoding a stored digital stream of audio signal (not illustrated) so as to drive the positive and negative input voltages for driver 205 accordingly. For illustration clarity, these input voltages and the corresponding P1 and M1 transistors are not shown in FIG. 2 but may be arranged as discussed with regard to driver 100. As is conventional, note that the power supply voltages VDD and VSS are varied to follow the amplitude of the audio signal (not illustrated) as driven by driver 205. In other words, as the amplitude of the audio signal rises and falls, the power supply voltages rise and fall in concert. Such a modulation of the power supply voltages saves power over an embodiment in which they are maintained at their peak respective states. To perform this modulation of the VDD power supply voltage, it is thus conventional for DSP 220 to control a positive charge pump 210. Similarly, it is conventional for DSP 220 to control a negative charge pump 215 to modulate the VSS power supply voltage. In a single-supply embodiment, only the VDD power supply voltage would be modulated in this fashion.

Given this pre-existing control of the charge pumps 210 and 215, processor 220 is readily modified to generate a non-linear ramping control signal for each charge pump. This modification is denoted is system 200 as a non-linear ramp generator 225 but it will be appreciated that such a generator may be implemented through a modification of the software being executed on processor 220. Alternatively, generator 225 may comprise a state machine or similar hardware.

Figures 3A, 3B:
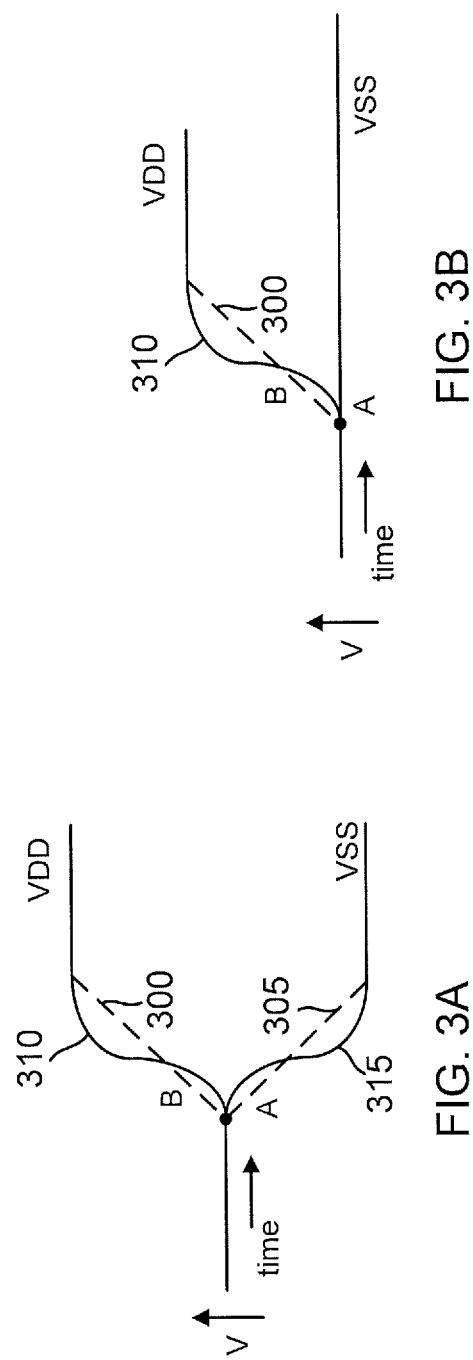
FIG. 3A is a waveform diagram of the nonlinear power supply voltage ramping for a dual-supply driver.
FIG. 3B is a waveform diagram of the nonlinear power supply voltage ramping for a single-supply driver.

As used herein, a "non-linear" ramping or changing of the power supply voltage may be a continuous or piece-wise linear. The advantages of this non-linear ramping may be better appreciated with regard to FIG. 3A and FIG. 3B. FIG. 3A illustrates the non-linear ramping of the power supply voltages for a dual-supply driver whereas FIG. 3B illustrates the non-linear ramping of the power supply voltages for a single-supply driver. In both cases, it was conventional to charge the power supply voltage (or voltages) using a relatively constant current such that the power supply voltages changed linearly. For example, linear ramp 300 illustrates a conventional increase of the VDD power supply voltage. Similarly, linear ramp 305 illustrates a conventional decrease of the VSS power supply voltage. These conventional linear ramping of the voltage supplies takes place relatively rapidly such as within the span of a few microseconds or less. Such abrupt changes of the DC values for the power supply voltages lead to high-frequency glitches in the driver output signal voltages that result in subjecting the listener to pop and click noise. The non-linear ramping as disclosed herein may take place over the same relatively short time scale yet result in significantly reduced voltage glitches such that the user is not subjected to the pop and click noise.

Due to the relatively small time scale over which the DC voltage levels change, the linear ramping of the power supply voltages is effectively a step function in the time domain. Such a step function in the time domain for the driver power supply voltages results in high frequency glitches in the frequency domain for the driver output signal. In that regard, one can appreciate that the beginning of ramps 300 and 305 (indicated as point A) represents a substantial jump in the rate of change for the power supply voltages. In particular, the rate of change goes from zero to some relatively high value. The non-linear ramping from generator 225 reduces this rate of change of after point A. For example, VDD power supply 310 in FIGS. 3A and 3B changes relatively slowly immediately subsequent to point A as compared to linear ramp 300. The non-linear ramping then has an accelerating rate of change until it reaches an inflection point B whereupon its rate of change decelerates until it finally reaches it nominal value such as over the same period as does conventional linear ramping 300. VSS power supply voltage 315 in FIG. 3A is ramped down in an analogous non-linear fashion. In the single-supply embodiment addressed by FIG. 3B, VSS power supply voltage 315 remains constant at ground. With regard to both endpoints of the linear ramping, one can readily appreciate that the rate of change for power supply voltages 310 and 315 of FIG. 3A is less than that for the corresponding linear ramped power supply voltages 300 and 305. It is this smoothing of the transitions from the power-off-state DC voltage to the nominal powered-on DC voltage for each power supply voltage that results in a substantial reduction of the high-frequency content in the driver output signal. In one embodiment, generator 225 may be deemed to comprise a means for nonlinearly changing a positive power supply voltage for an audio driver from a first DC value during a power-off state for the audio driver to a second DC value during an active state for the audio driver. Similarly, generator 225 may be deemed to comprise a means for nonlinearly changing a negative power supply voltage for an audio driver from a third DC value during the power-off state for the audio driver to a fourth DC value during an active state for the audio driver.

In one embodiment, generator 225 may be configured to use a raised cosine non-linear ramping to generate VDD power supply voltage 310 and VSS power supply voltage VSS. Alternatively, other non-linear ramping functions may be used such as a Gaussian curve. In all such cases, the goal is that the resulting rate of change for the voltage ramp begins by accelerating and ends by decelerating. In this fashion, the conventional abrupt transition from the beginning and ending DC values for the power supply voltages is smoothed so as to reduce the high-frequency content in the driver output signal. As noted earlier, generator 225 need not generate the power supply voltages so as to have continuous rates of changes such as in a raised cosine function but may instead approximate an accelerating curve that inflects so as to also decelerate.

Figure 4B:
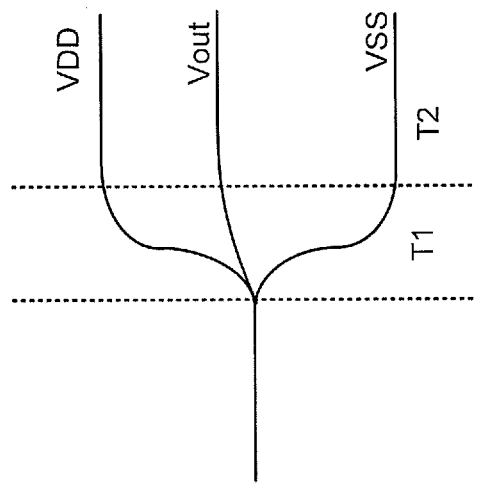
FIG. 4B is a waveform diagram illustrating activity periods for the averaging circuit of FIG. 4A.
Figure 4A:
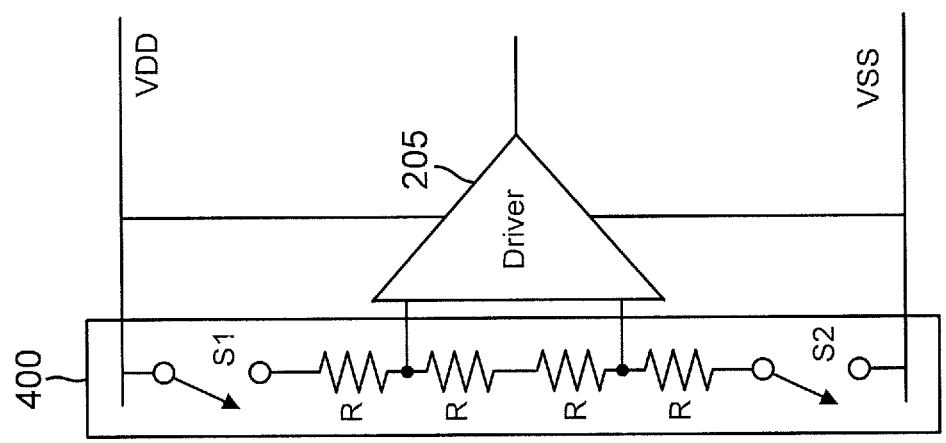
FIG. 4A is a circuit diagram of a driver including an averaging circuit in accordance with an embodiment of the disclosure.

To provide additional glitch suppression in the driver output signal, the power supply voltages may be averaged and applied as input signal voltages to the driver during the nonlinear ramping of the power supply voltages. FIG. 4A illustrates an averaging circuit 400 that produces an averaged input to a driver 205 using the power supply voltages. Driver 205 is illustrated in simplified form for illustration clarity so as to have a single common input signal. Averaging circuit 400 includes a voltage divider network such as formed with resistors R. Alternatively, capacitors may be used to form the voltage divider network. The VDD power supply voltage rail couples to a first terminal of the voltage divider network through a first switch S1. Similarly, the VSS power supply voltage rail couples to an opposing second terminal of the voltage divider network through a second switch S1. In alternative embodiments, switches S1 and S2 may be replaced with a single switch. Referring again to FIG. 2, nonlinear ramp generator 225 (or processor 220) controls switches Si and S2 to close at the initiation of the voltage ramping upon power-up of driver 205. As shown in the waveform diagram of FIG. 4B, the activation of averaging circuit 400 corresponds to the beginning of an averaging period T1. The duration of averaging period T1 may be fixed or programmable in alternative embodiments. With the development of the power supply voltages, switches S1 and S2 may then be opened at the beginning of a nominal operation period T2. Alternatively, switches S1 and S2 may be opened gradually at that time. The resulting averaging of the nonlinearly ramped power supply voltages to produce the input voltages for driver 205 further suppresses the high-frequency content of the resulting audio signal to further reduce pop and click noise. An example method of operation will now be discussed.

Figure 5:
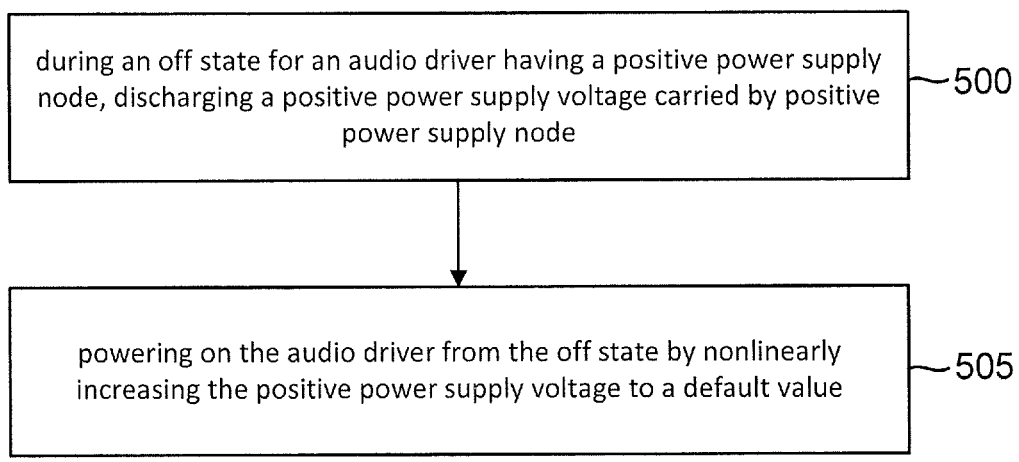
FIG. 5 is a flowchart of an example method of operation for the nonlinear ramping of driver power supply voltages in accordance with an embodiment of the disclosure.

FIG. 5 illustrates a flowchart of an example method of nonlinearly ramping the power supply voltage for an audio driver, The method includes an act 500 that occurs during an off state for the audio driver and comprises discharging a positive power supply voltage carried by a positive power supply node for the audio driver. The method also includes an act 505 of powering on the audio driver from the off state by nonlinearly increasing the positive power supply voltage to a nominal value.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A system comprising:
a driver configured to drive an output signal; and
a nonlinear power supply voltage generator configured to nonlinearly change at least one power supply voltage for the driver from a first DC value during a power-off state for the driver to a second DC value during an active state for the driver.

2. The system of claim 1, wherein the driver comprises an audio driver and wherein the nonlinear power supply voltage generator is configured to nonlinearly change the at least one power supply voltage to reduce a pop and click noise produced by the audio driver upon transitioning from the power-off state to the active state.

3. The system of claim 2, wherein the nonlinear power supply voltage generator is configured to nonlinearly change the at least one power supply voltage according to a raised cosine function.

4. The system of claim 2, wherein the nonlinear power supply voltage generator is configured to nonlinearly change the at least one power supply voltage according a Gaussian function.

5. The system of claim 2, wherein the nonlinear power supply voltage generator is configured to change the at least one power supply voltage according to a piecewise linear function.

6. The system of claim 2, wherein the audio driver comprises a serial stack of a PMOS transistor and an NMOS transistor.

7. The system of claim 2, wherein the at least one power supply voltage comprises a positive power supply voltage and a negative power supply voltage, the system further comprising:
a positive charge pump for producing the positive power supply voltage; and
a negative charge pump for producing the negative power supply voltage, wherein the nonlinear power supply voltage generator is configured to control the positive charge pump to nonlinearly change the positive power supply voltage and to control the negative charge pump to nonlinearly change the negative power supply voltage.

8. The system of claim 7, further comprising an averaging circuit configured to average the positive power supply voltage with the negative power supply voltage to produce an averaged input signal for the audio driver during a transition from the powered-off state to the active state.

9. The system of claim 8, wherein the averaging circuit comprises a voltage divider.

10. The system of claim 9, further comprising at least one switch configured to couple the voltage divider to a power supply rail for one of the positive and negative power supply voltages.

11. The system of claim 10, wherein the at least one switch is configured to close for a programmable duration during an onset of the nonlinear change for the positive and negative power supply voltages.

12. The system of claim 2, further comprising a processor configured to decode a digital audio signal according to a CODEC into at least one input signal for the audio driver, and wherein the processor is configured to implement the nonlinear power supply voltage using software.

13. The system of claim 2, wherein the nonlinear power supply generator comprises a state machine.

14. A method, comprising:
during a powered-off state for an audio driver having a positive power supply node for carrying a positive power supply voltage, discharging the positive power supply voltage to a first DC value; and
powering on the audio driver from the off state by nonlinearly increasing the positive power supply voltage from the first DC value to a second DC value.

15. The method of claim 14, wherein powering on the audio driver further comprises nonlinearly decreasing a negative power supply voltage from a third DC value to a fourth DC value.

16. The method of claim 15, further comprising: averaging the nonlinearly increasing positive power supply voltage with the nonlinearly decreasing negative power supply voltage to produce an input voltage signal for the audio driver during a transition from the powered-off state to an active mode for the audio driver.

17. The method of claim 14, wherein nonlinearly increasing the positive power supply voltage comprises increasing the positive power supply voltage according to a raised cosine function.

18. The method of claim 14, wherein nonlinearly increasing the positive power supply voltage comprises increasing the positive power supply voltage according to a Gaussian function.

19. A system, comprising:
an audio driver configured to drive an output signal; and
means for nonlinearly changing a positive power supply voltage for the audio driver from a first DC value during a power-off state for the audio driver to a second DC value during an active state for the audio driver.

20. The system of claim 19, further comprising a means for nonlinearly changing a negative power supply voltage for the audio driver from a third DC value during the power-off state for the audio driver to a fourth DC value during an active state for the audio driver.

* * * * *